United States Patent [19]

Feist

[11] 4,155,783
[45] May 22, 1979

[54] SEMICONDUCTOR STRUCTURES AND METHODS FOR MANUFACTURING SUCH STRUCTURES

[75] Inventor: Wolfgang M. Feist, Burlington, Mass.

[73] Assignee: Raytheon Company, Lexington, Mass.

[21] Appl. No.: 903,433

[22] Filed: May 8, 1978

Related U.S. Application Data

[62] Division of Ser. No. 754,723, Dec. 27, 1976, abandoned.

[51] Int. Cl.² .............. H01L 21/302; H01L 21/20; H01L 27/12
[52] U.S. Cl. ............................. 148/33.2; 148/175; 156/647; 357/50
[58] Field of Search .............. 148/33.2, 175, 1.5; 357/50; 156/647

[56] References Cited

U.S. PATENT DOCUMENTS

| | | | |
|---|---|---|---|
| 3,716,425 | 2/1973 | Davidsonn | 148/175 |
| 3,901,737 | 8/1975 | Dash | 148/1.5 |
| 3,920,482 | 11/1975 | Russell | 148/1.5 |
| 3,966,514 | 6/1976 | Feng et al. | 148/187 |
| 3,986,200 | 10/1976 | Allison | 357/55 |
| 4,047,195 | 9/1977 | Allison | 357/55 |
| 4,047,975 | 9/1977 | Widmann | 148/1.5 |
| 4,056,413 | 11/1977 | Yoshimura | 148/175 |
| 4,066,473 | 1/1978 | O'Brien | 148/1.5 |

OTHER PUBLICATIONS

Aboaf et al., "Dielectric Isolation" IBM-TDB, 18 (1976) 3295.

Primary Examiner—L. Dewayne Rutledge
Assistant Examiner—Upendra Roy
Attorney, Agent, or Firm—Richard M. Sharkansky; Joseph D. Pannone

[57] ABSTRACT

Semiconductor integrated circuit structures and manufacturing methods wherein isolation grooves are etched into a semiconductor body by first bringing an anisotropic etchant in contact with portions of the surface of the body which are exposed by windows formed in an etch-resistant mask to form grooves with side walls which intersect the surface at acute angles. Next, an isotropic etchant is brought in contact with the walls of the etched grooves to remove portions of the body which are underneath the etch-resistant mask such that the mask extends over the side walls of the resulting grooves, the bottom walls of such grooves are disposed under the windows and the side walls maintain acute angle intersection with the surface. Junction isolation regions are formed by ion implanting particles into the bottom walls of the grooves, the maks shielding the side walls from such particles. This self-aligning process accurately controls the placement of the junction isolation regions and thereby reduces the depth required for the grooves in providing dielectric isolation. Because the grooves have side walls which intersect the surface at acute angles, and because the grooves are relatively shallow because of the addition of accurately placed junction isolation regions, subsequent metallization processing is more readily controllable.

4 Claims, 10 Drawing Figures

SEMICONDUCTOR STRUCTURES AND METHODS FOR MANUFACTURING SUCH STRUCTURES

CROSS-REFERENCE TO RELATED APPLICATIONS

This is a division of application Ser. No. 754,723, Filed Dec. 27, 1976, abandoned.

BACKGROUND OF THE INVENTION

This invention relates generally to semiconductor structures and methods for fabricating such structures.

As is known in the art, semiconductor devices formed on a single crystal body may be isolated from one another by forming isolation grooves between such devices. The isolation grooves extend from the surface of an epitaxial layer formed on a semiconductor substrate through such epitaxial layer into the substrate. Air, or an oxide having a dielectric constant preferably less than the dielectric constant of the crystal body in the grooves, provides dielectric isolation between the semiconductor devices. It is sometimes desirable to increase the degree of isolation by forming high conductivity regions having impurities of a conductivity type opposite to that of the conductivity type of the epitaxial layer in the substrate beneath the bottom walls of the isolation grooves. While various techniques have been suggested for forming such regions, such techniques are relatively complex, unreliable and otherwise ineffective in producing high yield, high density, low cost monolithic integrated circuits.

SUMMARY OF THE INVENTION

In accordance with this invention an etch-resistant mask having windows formed therein is disposed over a surface of a semiconductor body. Isolation grooves are etched into such body by first bringing an anisotropic etchant into contact with the portions of the surface which are exposed by such windows to form grooves having side walls which intersect with the surface at acute angles. The formed grooves are further etched into the body by bringing an isotropic etchant in contact with the walls of the etched grooves which are exposed by the windows. Here the isotropic etchant attacks the semiconductor body under the etch-resistant mask such that the mask extends over the side walls of the resulting grooves and the bottom walls of such grooves are disposed under the windows. Particles are ion implanted into the semiconductor body through the windows, the mask shielding the side walls of the grooves from such particles, the windows allowing such particles to become implanted into the bottom walls of such grooves.

In a preferred embodiment of the invention the surface of the semiconductor body is oriented parallel to a <100> crystallogrophic plane of such body. The anisotropic etchant initially forms such isolation grooves with side walls substantially parallel to a <111> crystallographic plane of such body. The use of an anisotropic etchant forms the isolation grooves with a small degree of discontinuity between the planar surface of the body and the side walls, such degree of discontinuity being substantially maintained after the isotropic etchant completes the formation of the isolation grooves, thereby facilitating in the subsequent metallization process where interconnecting leads are formed over the isolation grooves. The isotropic etch also removes portions of the semiconductor body which are under the mask such that the mask extends over the side walls of the grooves and the bottom walls of such grooves are exposed by the windows, thereby enabling the etch-resistant mask used in the formation of the isolation grooves to be used as the ion implantation mask, ensuring that the ions are implanted into the bottom walls of the isolation grooves. That is, the process is a self-aligning process, accurately controlling the formation of isolation regions beneath the bottom walls of the isolation grooves. Because the placement of the isolation regions is accurately controlled, the depth required for the isolation grooves may be reduced. As a result, the depth to which the metallization process must form the interconnecting leads is reduced. Each of these features, namely the self-aligning process and the reduced depth of the isolation grooves, improves process yield and process cost.

In one embodiment of the invention, after the particles are ion implanted, a heating process is used to simultaneously oxidize the surface of the semiconductor body and drive the base region dopant of a transistor and the ion implanted particles further into the semiconductor body. By driving the ion implanted particles further into the body, the depths of the grooves are reduced, thereby improving the smoothness of the surface. Because the ion implanted particles and the base dopant are driven simultaneously, optimum use is made of this heating cycle which thereby reduces the requirements on the depths of the grooves.

In another embodiment of the invention, a layer of silicon nitride is used as a layer of the etch-resistant mask. During the heating cycle the silicon nitride layer is not oxidized, but the silicon side walls and bottom walls of the grooves are oxidized and, hence, backfilled with silicon dioxide, thereby further improving the degree of flatness of the surface.

The use of an isotropic etchant eliminates any requirement that corner compensation be made to the groove forming mask to obtain nearly rectangular features in the etched grooves.

BRIEF DESCRIPTION OF THE DRAWINGS

The above-mentioned and other features of the invention will become more readily apparent by reference to the following description taken in conjunction with the accompanying drawings, in which.

DESCRIPTION OF THE PREFERRED EMBODIMENTS

Figure 1:
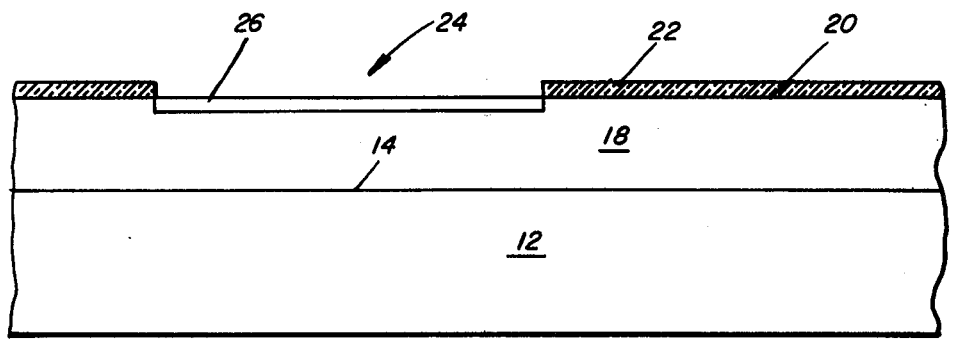
FIGS. 1–6 show diagrammatic cross-sectional views of a portion of an integrated circuit at various steps in the manufacture thereof in order to illustrate the method of manufacture of an embodiment of the present invention.

Referring now to FIG. 1, a single crystal semiconductor body 10 having a wafer 12 of P type conductivity silicon having a planar surface 14 oriented parallel to the <100> crystallographic plane of such wafer is shown. A subcollector region (not shown) of opposite type conductivity, i.e., N+ type conductivity, may be diffused in such wafer 12 using conventional photolithographic and diffusion processing techniques. An epitaxial layer 18 of N type conductivity, here 2.0 to 3.0 μm thick, preferably 2.5 μm thick, is formed on the surface 14 of wafer 12 in any conventional manner. The epitaxial layer 18 has a planar surface 20 oriented parallel to the <100> crystallographic plane of the wafer 12. A silicon dioxide layer 22, 1000–2000 Å thick, preferably 1500 Å thick, is formed, here thermally grown in any conventional manner on the surface 20 of the epitaxial layer 18, as shown. A window 24 is etched into the silicon dioxide layer 22 using conventional photolithography to produce a base diffusion mask. It should be noted that, while only one window 24 is shown, in practical application a plurality of windows is formed in the epitaxial layer 18 to form base regions for other semiconductor devices (not shown) which will be formed on the same wafer 12. Further, such diffusion is used in the formation of resistors (not shown) as is well known in the art. For simplicity, the formation of a single transistor will be discussed, it being understood that a plurality of active and/or passive elements will also be formed in the epitaxial layer 18. Referring again to FIG. 1, base region 26 is formed in the epitaxial layer 18 using any conventional diffusion process for diffusing into such regions a P type conductivity dopant, here boron, having a surface concentration in the order of $10^{20}$ atoms/cm$^3$. The base diffusion is performed in any conventional manner; here, however, the depth of such base region 26 is 1000–1500 Å thick. (This relatively shallow predeposition of boron atoms will be followed by a process which will drive such boron atoms further into the epitaxial layer 18 in a manner to be described.) After the base region 26 is formed as described, the silicon dioxide layer 22 is removed in any conventional manner. It is here noted that the base region 26 may be formed by ion implanting boron ions through window 24 using the silicon dioxide layer 22 as a mask. Alternatively, a photoresist mask may be used in place of the silicon dioxide mask when ion implanation of boron ions is used in the formation of the base region 26.

Figure 2:
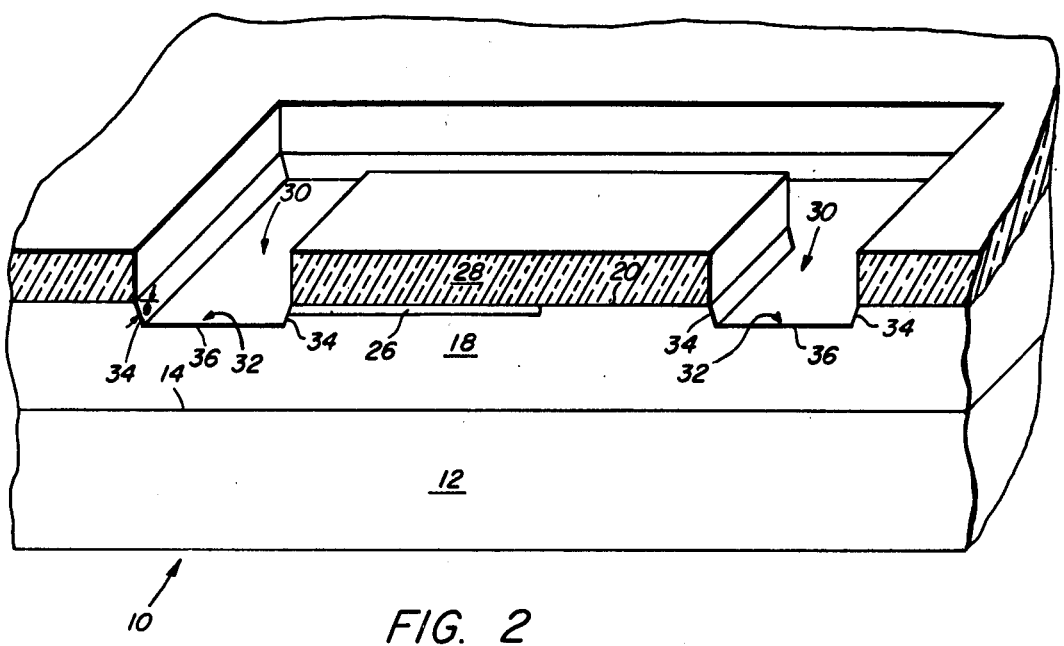

Referring now to FIG. 2, a silicon dioxide layer 28, here 3000–8000 Å thick, is formed on the surface 20 of the epitaxial layer 18, as shown. Here substantially all of the silicon dioxide layer 28 is formed on the surface 20 of epitaxial layer 18 using a relatively low (i.e., less than 900° C.) temperature chemical vapor deposition process in order to prevent the base dopant from being driven, to any substantial degree, further into the epitaxial layer 18.

Windows 30 are formed in the silicon dioxide layer 28, as shown, using conventional photolithography to expose portions of the surface 20 of the epitaxial layer 18 where isolation grooves 32 are to be formed about the active semiconductor device, here a transistor, as discussed above. Further, the mask, not shown, used to expose portions of surface 20 in the formation of windows 30 is orientated to etch such windows along the <110> crystallographic axes of the silicon wafer. Thus, the silicon dioxide layer 28 with the windows 30 formed therein serves as an etch-resistant mask for the formation of such isolation grooves 32. In particular, such grooves 32 are etched into the epitaxial layer 18 (and here into a portion of the base region 26, as shown) by first bringing an anisotropic etchant, here an ethylene diamine-pyrocatechol solution, in contact with the portions of the surface 20 which are exposed by the windows 30. Alternatively, other anisotropic etchants, such as a saturated solution of sodium hydroxide (NaOH) in water, may be used. Such anisotropic etchant etches away the portions of the epitaxial layer 18 exposed by the windows 30 with extremely little etching occurring to the silicon which is underneath the silicon dioxide layer 28. The anisotropic etchant produces grooves 32 which have truncated wedge-shaped cross-sections, as shown. The grooves 32 have side walls which are parallel to the <111> crystallographic plane of the wafer 12. Such side walls 34 make an acute angle θ, here 54.7°, with the planar surface 20. The width of the windows 30 is here 2.5 μm. The etching process continues until the bottom walls 36 of such grooves 32 reach a depth in the range of 0.3–0.8 μm, here preferably 0.5 μm, from the surface 20.

Figure 3:
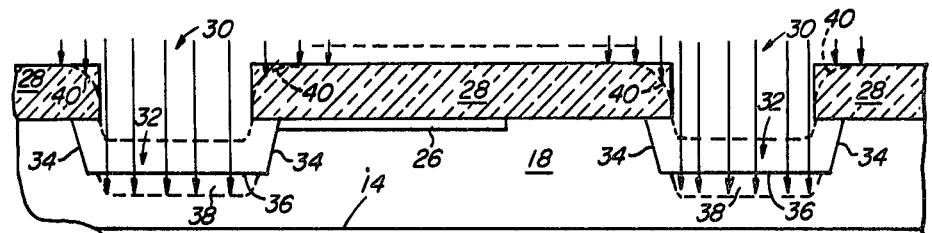

It should be noted that the anisotropic etching process is stopped when the bottom walls 36 of the grooves 32 are in the epitaxial layer. That is, when the grooves 32 are anisotropically etched to the depth of 0.5 μm, the anisotropic etchant is quenched and the grooves 32 are then etched with an isotropic etchant (here 9 HNO$_3$:0.9 HF:3 CH$_3$OOH parts per volume) by bringing such isotropic etchant in contact with the silicon which is exposed by the windows 30. As shown in FIG. 3, the isotropic etchant extends all boundaries of the anisotropically etched grooves 32 further into the expitaxial layer 18 (and into the base region 26). It is also noted that while such isotropic etchant etches the silicon underneath the silicon dioxide layer 28 the acute angle the side walls 34 make with the surface 20 is substantially retained. That is, the truncated wedge or truncated V-shaped cross-sections of the grooves 32 that were produced initially by the anisotropic etchant are substantially retained by the isotropic etchant. (The grooves 32 as initially produced by the anisotropic etchant are shown in phantom in FIG. 3.) The etching of the silicon underneath the silicon dioxide layer 28 enables such layer 28 to form a roof or shield over the side walls 34 while the windows 32 expose the bottom walls 36, as shown. That is, the silicon dioxide layer 28 forms a mask which extends over the side walls 34 of the resulting grooves 32 and the bottom walls 36 of such grooves 32 are disposed under the windows 30. It is noted that the isotropic etching process is stopped before the bottom walls 36 of the grooves 32 pass through the surface 14 of the wafer 12 (here the bottom walls 36 are 0.6–0.8 μm from the surface 14). That is, the grooves 32 are preferably formed entirely in the epitaxial layer 18. (It should be noted that, while the depths of the grooves 32 are formed by the etching processes and such processes are relatively accurately controllable, the process used to form the thickness of te epitaxial layer 18 is not as accurately controllable. Therefore, it is possible that if the epitaxial layer 18 is somewhat thinner than its nominal design depth, the bottom walls 36 will be formed at the surface 14 or slightly into the wafer 12.) As will become apparent, formation of relatively shallow grooves 32 facilitates the metallization process because the depth to which such metallization process must form interconnecting leads which pass over grooves 32 is also relatively shallow.

In order to increase the degree of isolation provided by the relatively shallow grooves 32 a dopant of P type conductivity, here boron ions in the form of B+F$_2$ primary ions, are implanted into the bottom walls 36, to form regions 38, using any conventional ion implantation process. The ion implantation is illustrated in FIG. 3 by arrows, not numbered. The silicon dioxide layer 28, in addition to serving as an etch-resistant mask in the formation of the grooves 32, serves as a mask for the ion implanation process because such layer 28 shields the side walls 34 from such ions while the windows 30 enable such ions to pass through the bottom walls 36. The use of B+F$_2$ ions offers the advantage of combining easily obtainable high ion current apparatus which implants in a relatively short time with a relatively small depth of penetration (i.e., 1000-1800 Å). To obtain such small depth of penetration using straight boron ions generally requires a 10-18 KeV implant energy level. Obtaining a short implanation time at such energy level with straight boron ions requires apparatus capable of operating at relatively high current levels, such low energy level, high current operating apparatus is generally not as readily available as high energy level, high ion current apparatus. The B$^{30}$F$_2$ primary ions are here implanted with an energy level of 70 KeV, thereby keeping the penetration depth into the silicon dioxide layer to less than 1500 Å. Because of this small penetration depth, i.e., less than 1500 Å, the overhang of shielding portions of the silicon dioxide layer 28, having a nominal thickness of 6000 Å, provide sufficient shielding against ions penetrating into the side walls 34 even though the edges of such layer 28 forming the windows 30 are slightly tapered to a thickness of 2000 Å (as indicated by the dotted lines 40, FIG. 3) as a result of the etching process. Here the ion implant dosages are in the range of $10^{12}$ to $10^{15}$ ions per cm$^2$, preferably $10^{13}$ ions per cm$^2$.

Figure 4:
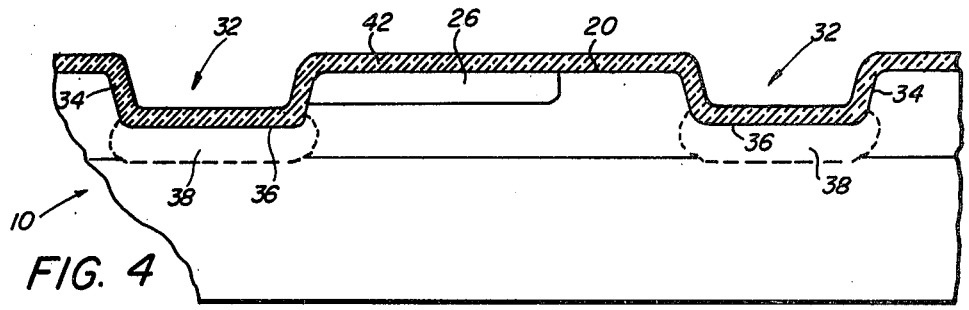

The semiconductor body 10 thus formed is next heated for about twenty minutes at a temperature in the range of 900° C.-1000° C. in an inert atmosphere, such as a nitrogen or argon atmosphere, to anneal any damage to the silicon crystal structure which is caused by the ion implanation process. Next the silicon dioxide layer 28 is removed, here with a hydrofloric acid (HF) solution. Then the semiconductor body 10 is heated in an oxidizing atmosphere of wet oxygen steam to a temperature of 1000° C. whereby a new silicon dioxide layer 42 is grown on the entire surface 20 including the side walls 34 and bottom walls 36 of grooves 32 as shown in FIG. 4. Here the silicon dioxide layer 42 is grown to a thickness of 3000 Å. Because semiconductor body 10 was processed at a temperature in the range of 900° C.-1000° C., the boron dopant in the base region 26 and the boron ions in the regions under the bottom walls 36, i.e., the region 38, are driven deeper into the body 10. In particular, the boron dopant in the base region 26 is driven to form a base region 26 which has a depth of 0.6-0.8 μm from the surface 20, and the implanted boron is likewise driven further into the body 10 to extend the isolation region 38 from the bottom walls 36 to at least into the wafer 12 as indicated. Therefore, it should be noted that the heating process used to drive the boron dopant in the base region 26 and the ion implanted boron in region 38 further into the semiconductor body 10 to their desired depths simultaneously forms the new silicon dioxide layer 42 as described. If desired, the thickness of layer 42 may be uniformly increased by adding silicon dioxide using a conventional chemical vapor deposition process.

Figure 5:
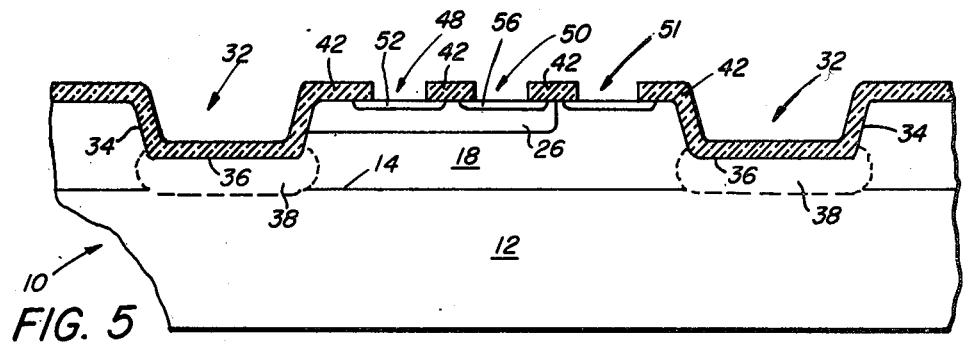

Openings 48, 50, and 51 (FIG. 5) are formed in the silicon dioxide layer 42 using conventional photolithography to enable the successive formation of a P type conductivity base contact region 56, N type conductivity emitter region 52 and N type conductivity collector region 54, as shown, by any well known diffusion or ion implanation process.

Figure 6:
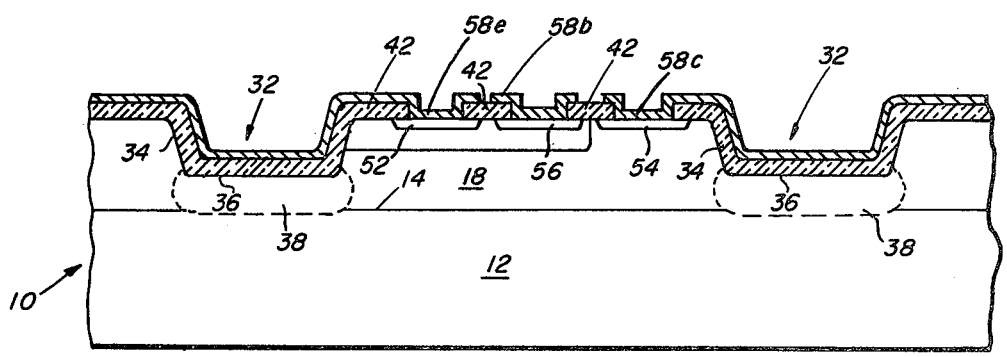

Metal leads 58b, 58e, 58c are then formed over portions of the silicon dioxide layer 42 and through the windows formed in such layer 42, such leads making ohmic contact with the base, emitter and collector regions 56, 52, 54, respectively, using any conventional metallization process. The resulting structure is shown in FIG. 6.

Having described the formation of an active semiconductor device, here a transistor, it should be noted that the ion implant regions 38 together with the oxide layer 42 formed in the etched grooves 32 isolate such semiconductor device from the other active or passive semiconductor devices (not shown) formed in the epitaxial layer 18 which are outside the region bounded by such grooves 32. The formation of the ion implanted regions 38 provides junction isolation for such semiconductor device and the etched and oxidized grooves 32 provide dielectric isolation for such device. The formation of the ion implanted regions 38 reduces the depth required for the grooves in providing dielectric isolation as compared with the depth required for such grooves if the ion implanted regions were not formed to provide the additional junction isolation described above. The self-aligning process described above, where the etch resistant mask used to form the grooves 32 also serves as the ion implanation mask, thereby ensures accurate placement of the ion implant regions 38. The initial use of an anisotropic etchant enables such grooves 32 to be formed with a relatively small discontinuity between the surface of the expitaxial layer 18 and the side walls 34 of such grooves 32. The shallow depth of the grooves 32 and the small discontinuity between the surface of the epitaxial layer 18 and the side walls 34 of the grooves 32 facilitate in the metallization process, thereby reducing process cost and improving process yield. The use of a single heating process to simultaneously oxidize the surface of the semiconductor body and to drive dopant impurities in the base region 26 and in the regions 38 further into the body 10 to their desired depths also improves process yield.

Figure 7:
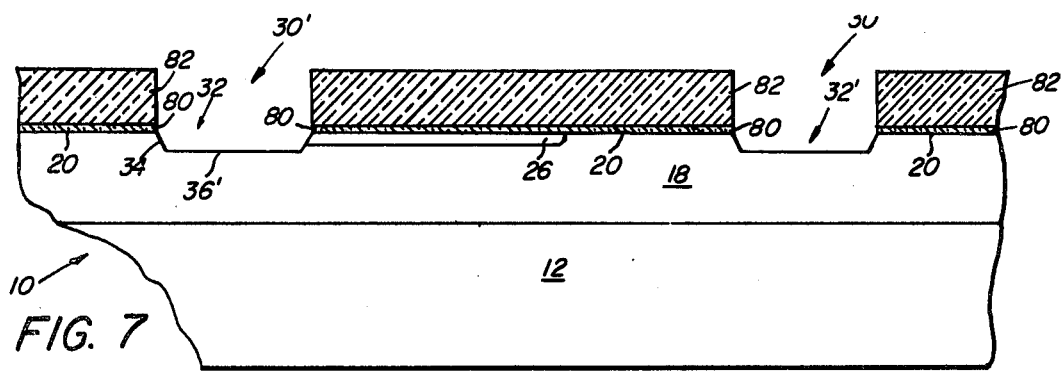
FIGS. 7–8 show diagrammatic cross-sectional views of a portion of an integrated circuit at various steps in the manufacture thereof in order to illustrate the methods of manufacture of an alternative embodiment of the present invention.

In a first alternative embodiment of the invention, after forming the base region 26 and removing the silicon dioxide layer 22 as described in connection with FIG. 1, a relatively thin silicon dioxide layer 80, here 500 Å thick, is formed on the surface 20 of the epitaxial layer 18 and the base region 26 as shown in FIG. 7. A layer 82 of silicon nitride (Si$_3$N$_4$), 500 Å-2000 Å thick, preferably 2000 Å thick, is formed over the silicon dioxide layer 80 in any conventional manner, here by chemical vapor deposition (alternatively a conventional sputtering process may be used). The relatively thin silicon dioxide layer 80 is formed between the epitaxil layer 18 and the silicon nitride layer 82 to prevent internal stresses from being developed within the silicon nitride layer 82 as would generally occur if the silicon nitride layer 82 were formed on the epitaxial layer 18 directly.

Having formed the relatively thin silicon dioxide layer 80 and the silicon nitride layer 82, windows 30 are formed in such layers 80, 82 using conventional photolithography. First, a solution of hydrofluoric acid (HF) is used to etch a silicon dioxide mask by bringing such solution in contact with the portions of the silicon dioxide layer 80 to be etched, and then a hot phosphoric acid solution is used to remove unwanted portions of silicon nitride layer 82, as is well known in the art. Alternatively, the unwanted portions of the nitride layer 82 may be removed by conventional R.F. (radio frequency) plasma etching techniques and a photoresist mask. Grooves 32' are formed in the silicon body 10 using first an anisotropic etchant and then an isotropic etchant as described in connection with FIG. 2. That is, the windows 30' expose portions of the surface 20 of the epitaxial layer 18 where isolation grooves 32' are to be formed about the active semiconductor device, have a transistor. Thus, the silicon dioxide layer 80 and the nitride layer 82 serve as an etch-resistant mask for the formation of the isolation grooves 32'. That is, grooves 32' are etched into the expitaxial layer 18 by first bringing an anisotropic etchant in contact with the surface 20 which is exposed by the windows 30' to produce grooves 32' which have a truncated wedge-shaped cross-section with side walls 34' parallel to the <111> crystallographic plane of the wafer 12. The side walls 34' thereby make an acute angle with the surface 20. The grooves 32' are then further etched by bringing an isotropic etchant in contact with the silicon which is exposed by the windows 30'. The isotropic etchant cuts under the oxide-nitride layers 80, 82 to enable such layers 80,82 to form a roof or shield over the side wlls 34' while the windows 32' expose the bottom walls 36'. The latter etching process is stopped before the bottom walls 36' of the shallow grooves 32' pass through the surface 14 of the wafer 12 as described in connection with FIG. 3.

Figure 8:
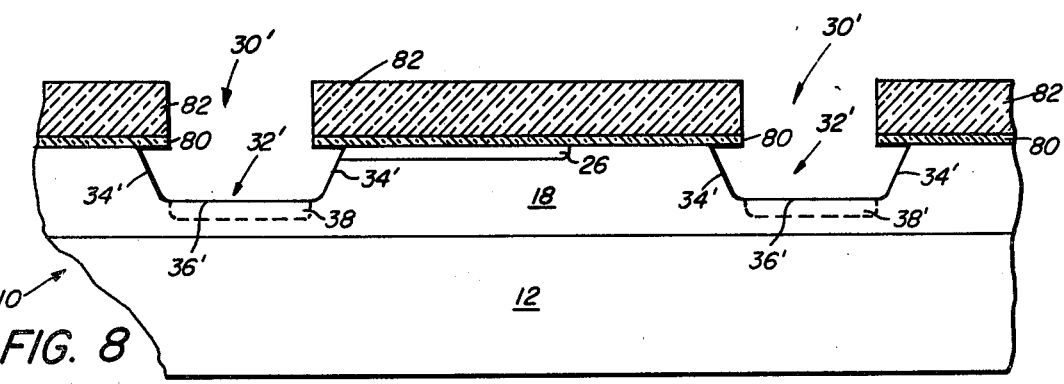

As discussed in connection with FIG. 3, in order to increase the degree of isolation provided by the shallow grooves 32' a dopant of P type conductivity particles is ion-implanted into the regions 38' underneath the bottom walls 36' as shown in FIG. 8. The oxide-nitride layers 80, 82, in addition to serving as an etch-resistant mask in the formation of the grooves 30', serve as a mask for the ion implanation process because such layers 80, 82 shield side walls 34Z' from such ion while windows 30' enable such ions to pass into the bottom walls 36'. Again the ion implanation process and groove formation process are self-aligning processes ensuring that the regions 38' are in the bottom walls 36' of the grooves 32'.

After such ion implanation process the silicon dioxide layer 80 and the silicon nitride layer 82 are stripped from the semiconductor body 10 using a hydrofluoric acid (HF) solution to remove the oxide layer 80 and a suitable hot phosphoric acid solution to remove the nitride layer 82 in any conventional manner. Alternatively, a plasma etcher such as the plasma etcher manufactured by LFE Corportion, Waltham, Mass., may be used to remove the oxide-nitride layers 80, 82. Having removed such layers 80, 82, the surface 20 is oxidized as described in connection with FIG. 4. Such oxidation process drives the boron dopant into base region 26 and the $B^{30}F_2$ ions further into the semiconductor body 10 to the desired depths and simultaneously forms a new silicon dioxide layer. Such new silicon dioxide layer is used in connection with the formation of base emitter and collector regions and subsequent metallization as described in connection with FIGS. 5 and 6.

Figure 9:
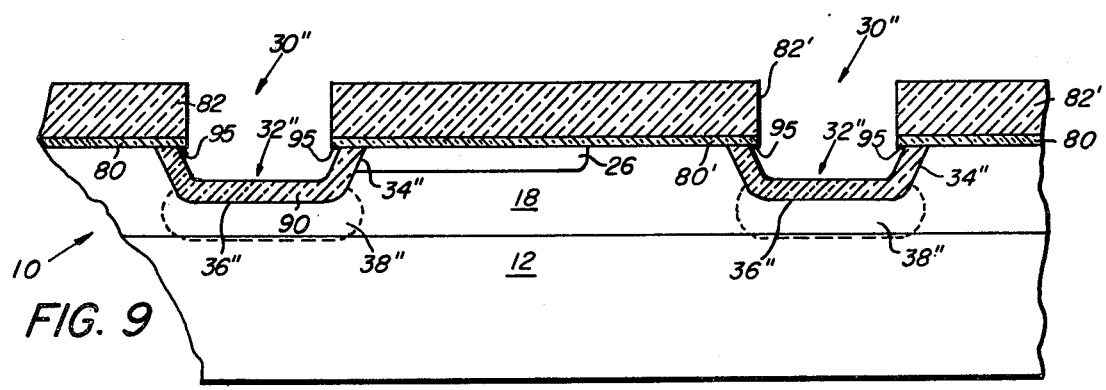
FIGS. 9 and 10 show diagrammatic cross-sectional views of a portion of an integrated circuit at various steps in the manufacture thereof in order to illustrate the methods of manufacture of a further embodiment of the present invention.
Figure 10:
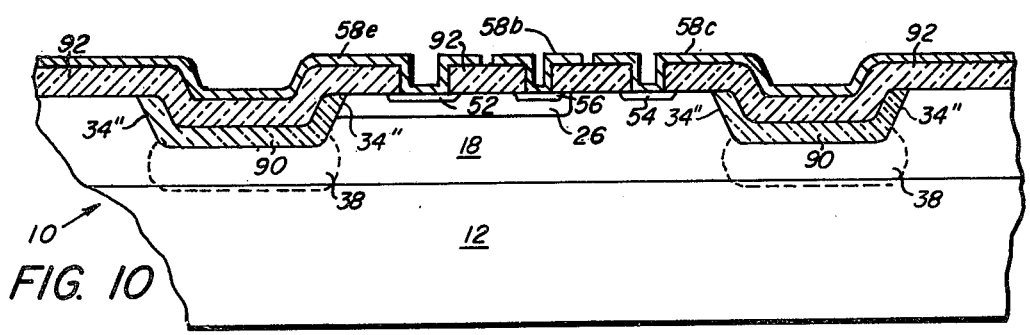

In a second alternative embodiment of the invention, after forming the epitaxial layer 18 a relatively thin silicon dioxide layer 80', here 500 Å thick, is formed on the epitaxial layer 18 as shown in FIG. 9, using any conventional technique. A layer of silicon nitride 82' is formed on such silicon dioxide layer 80' as discussed in connection with FIG. 7. Windows 30" are formed in such layers 80', 82', and isolation grooves 32" are formed in the epitaxial layer using the anisotropic-isotropic etching processes described in connection with FIGS. 7 and 8. Ions, here P type conductivity ions, are implanted into the semiconductor body 10 disposed beneath the bottom walls 36" using the self-aligning process described in connection with FIGS. 7 and 8. The semiconductor body 10 is placed in an oxidizing atmosphere. The side walls 34" and bottom walls 36" of the grooves 32" being silicon, are oxidized in such atmosphere forming a layer 90 of silicon dioxide on the side walls 34" and the bottom walls 36". The silicon nitride layer 81', however, is not oxidized and, therefore, the grooves 32" are backfilled, here 0.8–1.2 μm, with the silicon dioxide of layer 90 as shown in FIG. 9. During this heating process, the boron dopant in base region 26 and the ions implanted in dopant regions 38" are simultaneously driven into the semiconductor body 10 as described in connection with FIG. 4.

Having backfilled the grooves 32" by forming a silicon dioxide layer 90 hot phosphoric acid is used to remove the silicon nitride layer 82'. A solution of hydrofluoric acid (HF) is then brought in contact with the semiconductor body 10 to remove 250 Å of layer 80'. It is noted that, because the protruding edges 95 of such layer 80' are attacked by the acid from the top and bottom, removal of 250 Å of layer 80' will remove 500 Å of the protruding edges 95. The upper surface of the semiconductor body 10 is then coated with a layer 92 of silicon dioxide, here 0.3–1.0 μm thick, in any conventional manner, here by ehcmical vapor deposition. The silicon dioxide layer 92 is used as a mask in the formation of base contact, emitter and collector contact regions 56, 52, 54 as discussed in connection with FIG. 6. Metal leads 58b, 58e, 58c are formed as discussed in connection with FIG. 6. It is noted that, because the layer 92 is formed selectively in the grooves 32", the surface on which such leads which pass over the grooves are formed is smoother than the surface shown in FIG. 6.

Having described preferred embodiments of this invention, it is evident that other embodiments incorporating its concepts may be used. For example, the side walls may be formed at other acute angles with respect to the surface of the semiconductor body by forming such side walls parallel to the <331> or <113> crystallographic planes by suitable orientation of the etching mask used in the etching process. It is felt, therefore, that this invention should not be restricted to the disclosed embodiments, but rather should be limited only by the spirit and scope of the appended claims.

I claim:

1. An integrated circuit structure comprising:
   (a) a semiconductor substrate; and
   (b) an epitaxial layer having a planar surface formed on such substrate, such epitaxial layer having isolation grooves formed therein, such grooves having side walls disposed in planes substantially parallel to the <111> crystallographic plane of the substrate making an acute angle with the plane of the planar surface of the epitaxial layer and having bottom walls formed in the epitaxial layer, the bottom walls being formed at a depth in the order to one-half the thickness of the epitaxial layer or less than one-half the thickness of such epitaxial layer.

2. The integrated circuit structure recited in claim 1 including an oxide layer disposed only over the side walls and the bottom walls of the grooves to at least partially fill the grooves.

3. The integrated circuit structure recited in claim 1 including isolation regions of type conductivity opposite to the type conductivity of the epitaxial layer, such region extending from the bottom walls of the grooves, through the epitaxial layer, into the semiconductor substrate.

4. The integrated circuit structure in claim 2 including a second oxide layer disposed on the first-mentioned oxide layer and disposed on the planar surface of the epitaxial layer.

* * * * *